United States Patent [19]
Chen et al.

[11] Patent Number: 5,106,773
[45] Date of Patent: Apr. 21, 1992

[54] PROGRAMMABLE GATE ARRAY AND METHODS FOR ITS FABRICATION

[75] Inventors: Cheing-Long Chen, Plano; David K. Liu, Dallas; Howard L. Tigelaar, Allen, all of Tex.

[73] Assignee: Texas Instruments Incorporated, Dallas, Tex.

[21] Appl. No.: 595,063

[22] Filed: Oct. 9, 1990

[51] Int. Cl.$^5$ .................. H01L 71/70; H01L 27/00
[52] U.S. Cl. .......................... 437/51; 437/52; 437/170; 437/43; 437/922
[58] Field of Search .............. 437/51, 52, 170, 922, 437/228, 43; 148/DIG. 55

[56] References Cited

U.S. PATENT DOCUMENTS

| | | | |
|---|---|---|---|
| 4,569,120 | 2/1986 | Stacy et al. | 148/DIG. 55 |
| 4,823,181 | 4/1989 | Mohsen et al. | |
| 4,876,220 | 10/1989 | Mohsen et al. | 437/52 |
| 4,914,055 | 4/1990 | Gordon et al. | 437/228 |
| 4,916,090 | 4/1990 | Motai et al. | 437/170 |
| 4,943,538 | 7/1990 | Mohsen et al. | 437/170 |

OTHER PUBLICATIONS

William S. Carter, et al., article entitled "A User Programmable Reconfigurable Logic Array", 1986, Custom Integrated Circuits Conference, 1986 IEEE.

Sau Wong et al., article entitled "CMOS Erasable Programamble Logic with Zero Standby Power", 1986 IEEE International Solid-State Circuits Conference.

Abbas El Gamal, et al., article entitled "An Architecture for Electrically Configurable Gate Arrays", IEEE Journal of Solid-State Circuits, vol. 24, No. 2, Apr. 1989.

*Primary Examiner*—Brian E. Hearn
*Assistant Examiner*—Kevin M. Picardat
*Attorney, Agent, or Firm*—Gary C. Honeycutt; Richard Donaldson; William E. Hiller

[57] ABSTRACT

Circuitry 12 is formed at the face of a layer semiconductor 34. The circuitry includes a plurality of contact points 22 and 24. At least one anti-fuse 14 is formed in a layer vertically displaced from circuitry 12. Anti-fuse 14 is operable to selectively connect together certain ones of said contact points 22 and 24.

3 Claims, 7 Drawing Sheets

PROGRAMMABLE GATE ARRAY AND METHODS FOR ITS FABRICATION

TECHNICAL FIELD OF THE INVENTION

This application relates in general to programmable circuitry and particular, to a programmable gate array and methods for its fabrication.

BACKGROUND OF THE INVENTION

Field programmable gate arrays (FPGA) are integrated circuits consisting of two primary elements: An array of universal logic modules and a corresponding array of anti-fuses. The universal logic modules are made up of a number of functional devices, such as diodes, transistors, resistors and the like. The functional devices, in turn, are interconnected to create a number of digital logic devices such as NAND gates, AND gates and OR gates. A number of the inputs and outputs of these logic devices provide the inputs/outputs of the universal logic modules in which they reside. The inputs/outputs of the universal logic modules are connected to the array of anti-fuses such that various combinations of the inputs/outputs of the universal logic modules in the array can be created.

The anti-fuses essentially comprise an upper electrode and a lower electrode with a layer of thin dielectric or amorphous silicon therebetween. The first electrode may, for example, be connected to a selected input/output of a selected logic modules and the second electrode connected to a similar input/output of a second selected universal logic module. The connection between the two selected input/output terminals will be open until the connection is programed. The connection is programed by grounding one of the electrodes of the anti-fuse while applying a voltage to the other. The resulting current shorts out the anti-fuse material between them and the desired connection is made.

In currently available field programmable gate arrays, the anti-fuses are formed as an array adjacent a separate surface area of the substrate. The surface area adjacent which the anti-fuses are formed is laterally displaced from the surface area of the substrate over which the universal logic modules are formed. This configuration consumes area on the substrate which could be better used to form additional universal logic modules such that the capability of the gate array may be improved. In the alternative, the overall size of the integrated circuit could be significantly reduced if the need for substrate surface area could be reduced. Thus, currently programmable gate arrays have limited flexibility in downsizing and increased functional capability. Further, with the array of anti-fuses formed laterally to the universal logic modules, the conductors connecting the logic module to the array of anti-fuses must be significantly longer increasing problems with excess capacitance and resistance.

Therefore, a need has arisen for an improved field programmable gate array which makes more efficient use of the substrate surface of the integrated circuit.

SUMMARY OF THE INVENTION

According to the invention, circuitry is formed at the face of a layer of semiconductor which includes a plurality of contact points. At least one anti-fuse is formed vertically displaced from said circuitry. The anti-fuse is operable to connect certain ones of the contact points.

In a preferred embodiment of the present invention, a programmable logic array is provided as a multi-layer integrated circuit. An array of universal logic modules is formed at a face of a layer semiconductor with each universal logic module having a at least one input/output contact. An array of anti-fuses are formed at a layer vertically spaced from the face of the semiconductor. The anti-fuses comprising the array are operable to selectively connect together certain of the input/outputs contacts of the array of universal logic modules.

The present invention provides distinct advantages over the prior art. By vertically offsetting the anti-fuses above the universal logic modules, the amount of space taken up on the semiconductor substrate is significantly reduced. The area on the substrate normally required in prior art programmable logic arrays can now be used for additional functional devices. Alternatively, the overall size of the substrate can be reduced by the amount of area saved by vertically offsetting the array of anti-fuses.

BRIEF DESCRIPTION OF THE DRAWINGS

Other aspects of the invention and their advantages will be discerned when one refers to the following detailed description as taken in conjunction with the drawings in which.

DETAILED DESCRIPTION OF THE INVENTION

Figure 1:
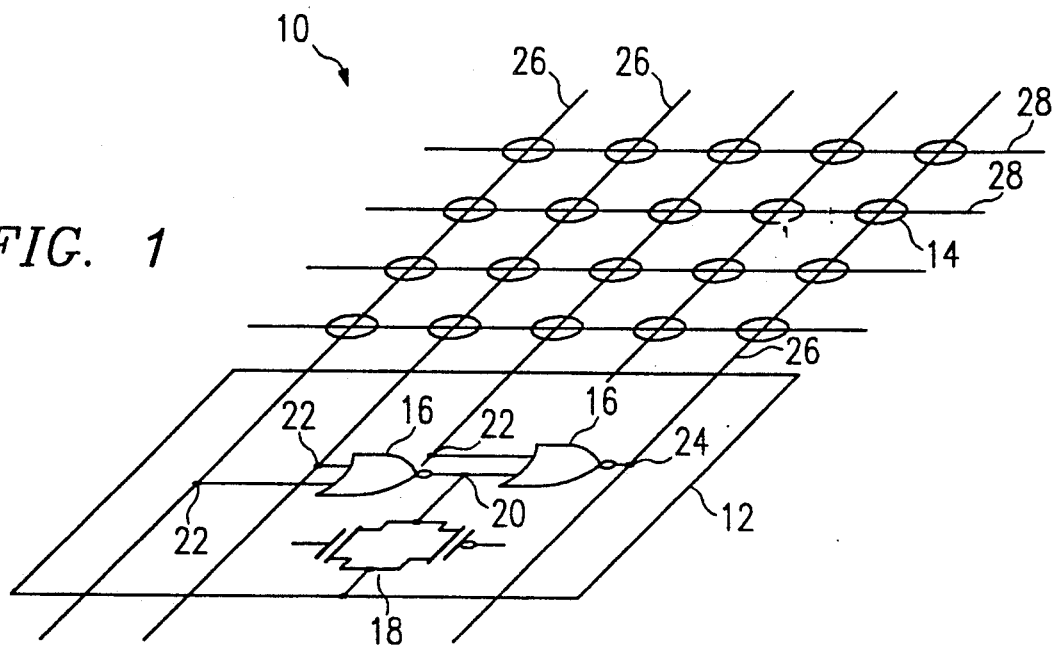
FIG. 1 is an isometric schematic drawing of a portion of a field programmable gate array according to the prior art.

Referring first to FIG. 1, a small portion of a field programmable gate array (FPGA) 10 is shown which includes a universal logic module 12 and an array of anti-fuses 14. The array of anti-fuses 14 is formed in an area on the face of gate array 10 laterally offset from universal logic module 12. A pair of NOR gates 16 and a pass transistor 18 are shown as typical logic devices composing universal logic module 12, as known in the art. In practice, universal logic module 12 may be formed by a number of such devices which may also include NAND gates, OR gates and the like. Conductors 20 provide intermodule connections between the various logic devices in universal logic module 12. Input contacts 22 and outputs contacts 24 of universal logic module 12 are connected to conductors 26 and 28. Where conductors 26 and 28 intersect, the anti-fuses 14 are formed as is known in the art by sandwiching an anti-fuse material between the intersecting surfaces of conductors 26 and 28.

Figure 2:
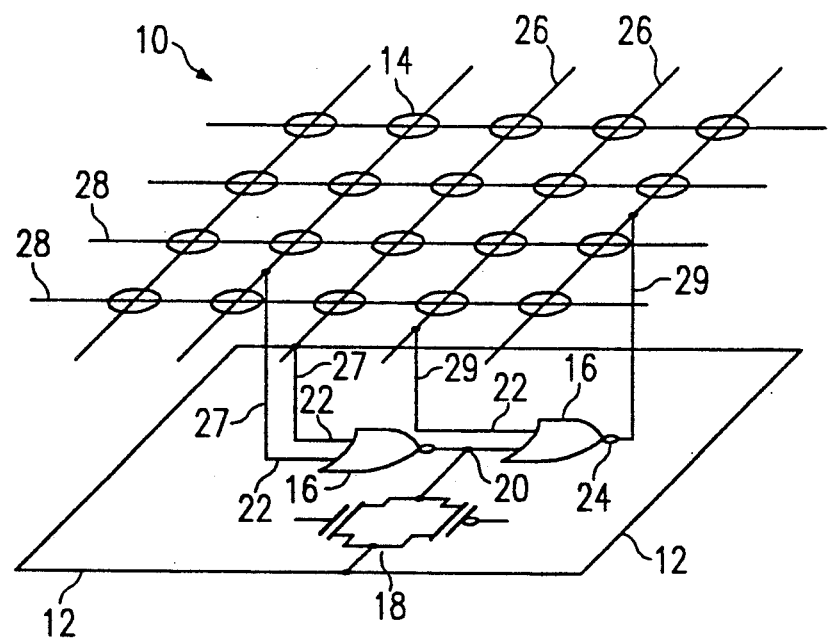
FIG. 2 is an isometric schematic drawing of a portion of a field programmable gate array according to the present invention.

FIG. 2 depicts a small portion of a field programmable gate array 10 according to the present invention. In the present invention, universal logic module 12 is formed on a first level while the array of anti-fuses 14 is formed vertically offset from universal logic module 12, thereby saving substantial space on the face of field programmable gate array 10. Conductors 26 and 28 no longer run across the face of gate array 10 to couple with input/output contacts 22 and 24. Rather, interlevel contacts 27 and 29 are formed to create the desired connections.

The fabrication of a field programmable gate array 10 according to the present invention can now be described in detail.

Figure 3:
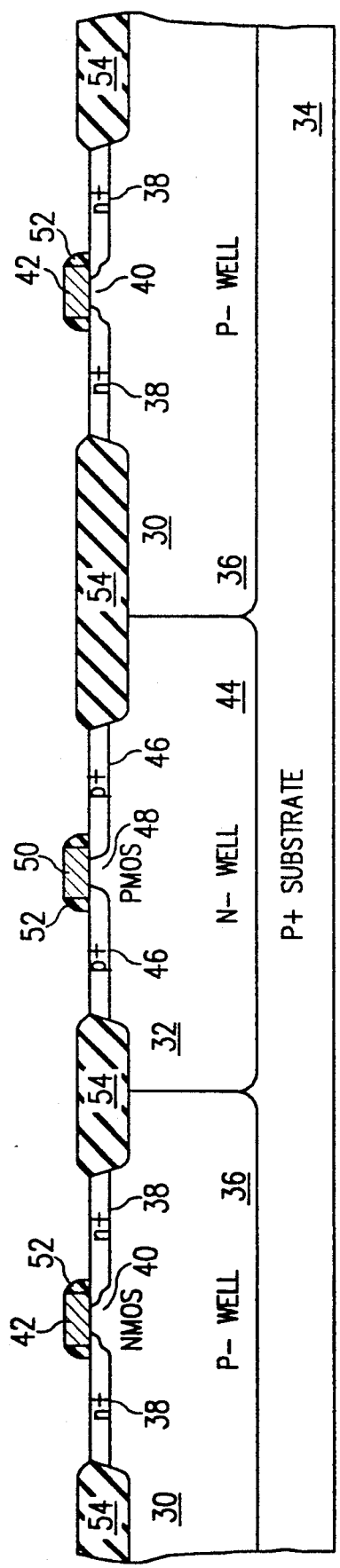
FIGS. 3 through 12 are greatly enlarged schematic elevational sectional views of a semiconductor workpiece showing the fabrication of a portion of a field programmable gate array according to the present invention.

FIG. 3 depicts a small cross-section of field programmable gate array 10. A pair of NMOS transistors 30 and a PMOS transistor 32 are shown formed at the face of a P+ substrate 34. Transistors 30 and 32 are typical of a number of functional devices which in turn make up the logic devices (such as NOR gates 16) composing universal logic module 12. The functional devices are not necessarily limited to transistors alone, but may also include diodes and the like. NMOS transistors 30 are formed by conventional methods in P− wells 36. Each NMOS transistor 30 includes a pair of source/drain regions 38 spaced by a channel 40, controlled by a gate 42. PMOS transistor 32 is formed by conventional methods in an N-well 44. Transistor 32 includes a pair of P+ source/drain regions 46 spaced by a channel 48 controlled by a gate 50. Sidewall oxides 52 are formed along the edges of each of the gates 42 and 50 to provide isolation from subsequently formed conductors. Transistors 30 and 32 are isolated from each other by field oxide regions 54, also formed by conventional means.

Figure 4:
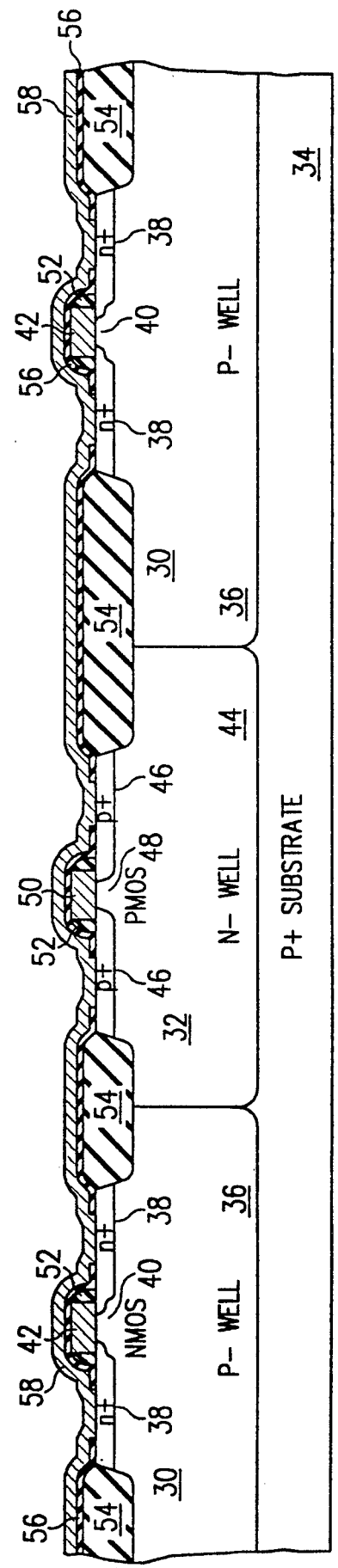

In FIG. 4, a layer 56 of interlayer insulator has been deposited, patterned and etched. Interlayer insulator 56 may be for example, oxide, oxide/nitride or oxide/nitride/oxide. Following the patterning and etching of insulator layer 56, a layer of polycrystalline silicon 58, is formed across the face of the workpiece.

Figure 5:
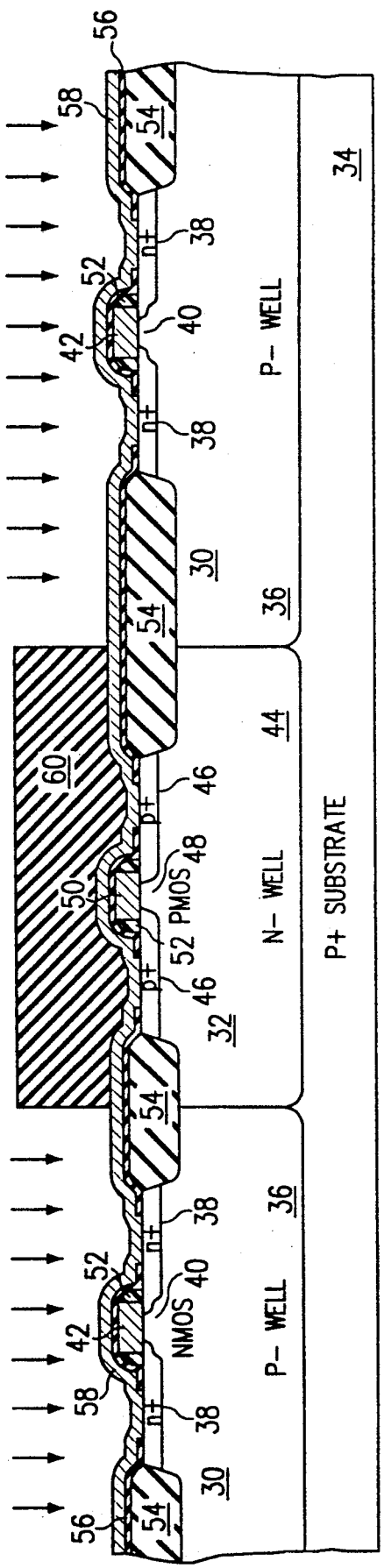

Next in FIG. 5, the portion of conductor layer 58 overlying PMOS transistor 32 has been masked by a layer of photoresist 60. An implant of arsenic or phosphorous is performed to convert the exposed portions of poly layer 58 to a n-type conductor such that a proper electrical connection can be achieved with n+ source/drain regions 38.

Figure 6:
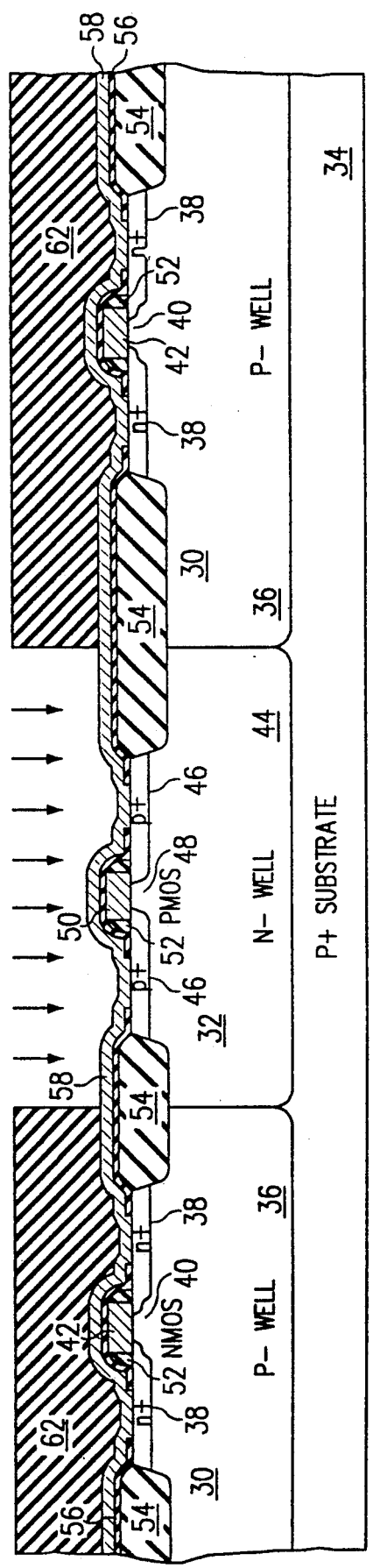

In FIG. 6, a second implantation process similar to that shown in FIG. 5 is performed. In this case, the areas of poly layer 58 overlying NMOS transistors 30 are masked with a layer 62 of photoresist. The portion of poly layer 58 overlying PMOS transistor 32 is exposed and an implantation of boron performed. During the implantation, the exposed portion of poly layer 58 is converted into a p-type conductor, such that a proper electrical connection with p+ source/drain regions 46 can be achieved.

Figure 7:
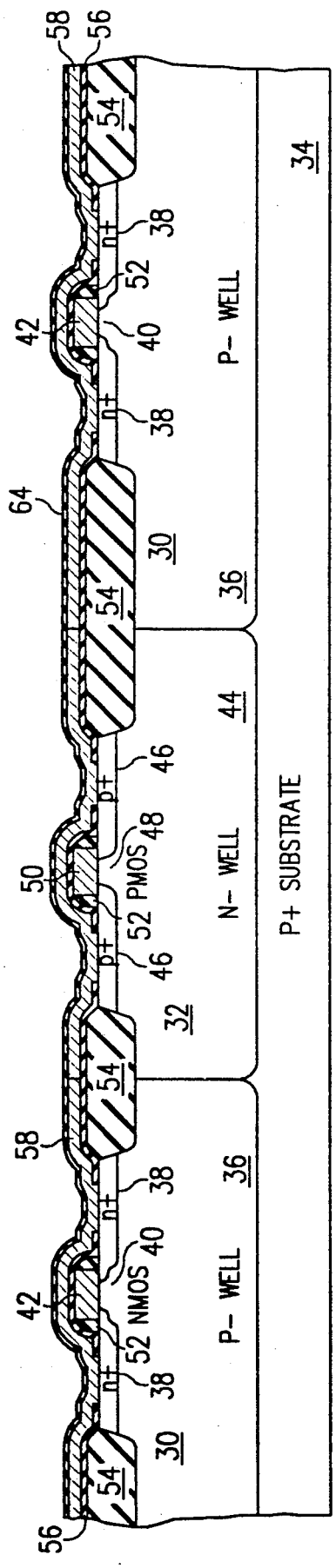

In FIG. 7, a layer silicide 64 has been formed across the workpiece such that the n-type and p-type portions of poly layer 58 are electrically connected. Silicide layer 64 may be for example, titanium silicide tungsten silicide, or other siliciding materials, known in the art.

Figure 8:
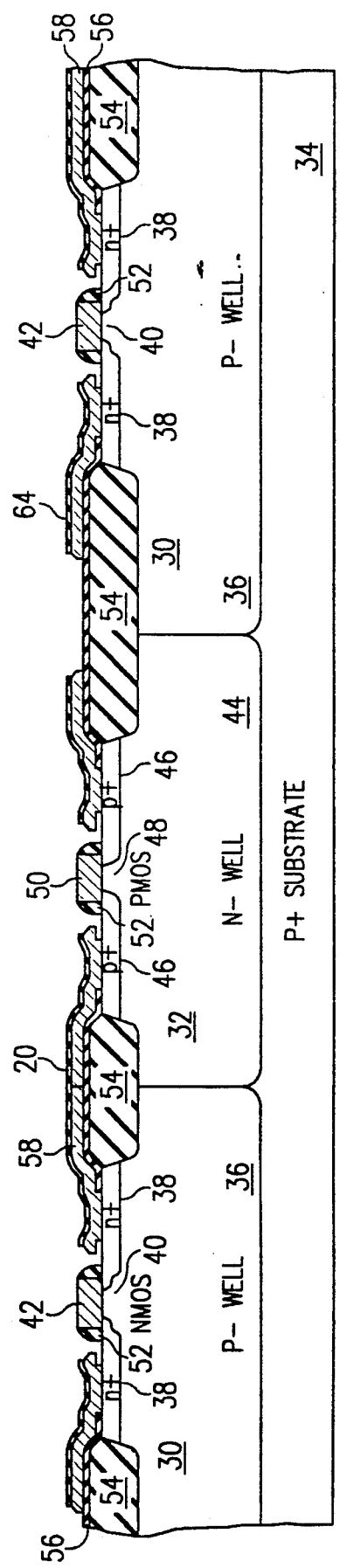

In FIG. 8, poly layer 58 and silicide layer 64 have been patterned and etched to form a first layer of interconnect, including intermodule interconnections 20.

Figure 9:
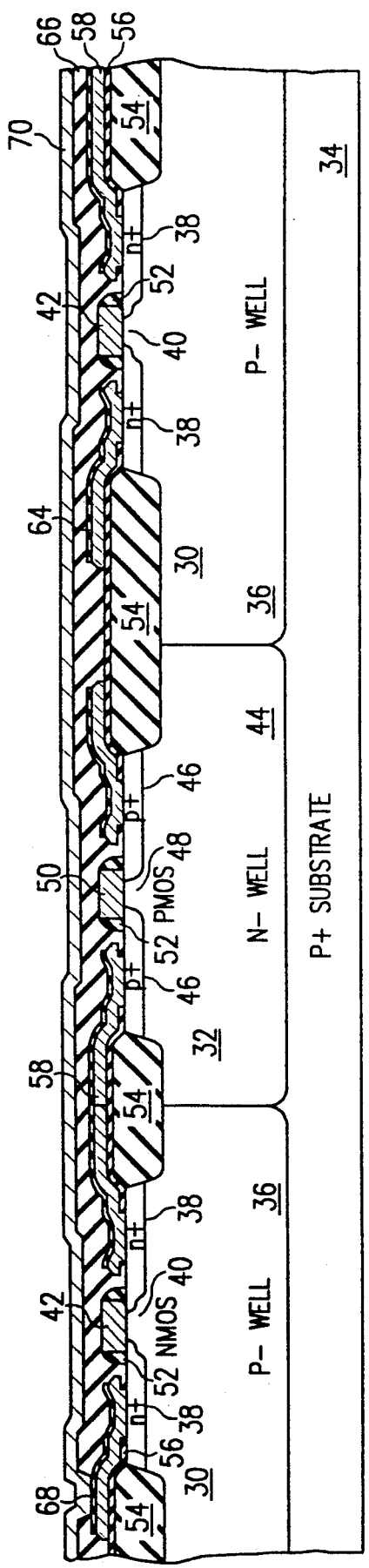

Next, in FIG. 9, an insulating layer 66 has been grown or deposited across the workpiece. Preferably, insulator layer 66 is a low temperature oxide, such as TEOS, such that during the formation of insulator layer 66, the source/drain regions 38 and 46 will not be exposed to excessive heat which may cause further diffusion in their corresponding wells. Additionally, it is preferable that insulator layer 66 be planarized such that subsequently formed layers will have minimal surface discontinuities.

A window 68 has been etched through insulator 66 using a conventional method and a layer of conductor 70 deposited to form a contact with the underlying conductor layer 58. Conductor layer 70 is preferably a layer of conductive polycrystalline silicon (poly), however, it may also be a layer of metal or silicide.

Figure 10:
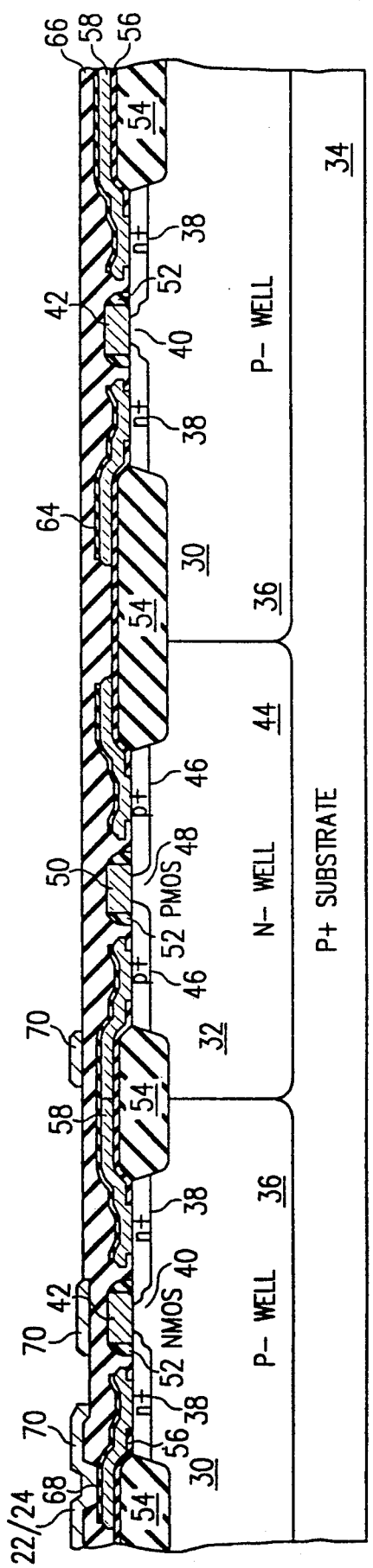

Referring to FIG. 10, conductor layer 70 has been patterned and etched to define the next layer of interconnect. The portion of conductor layer 70 contacting conductor layer 58 through window 68 will provide a first alternate way of providing interlevel interconnections 27 and 29 between input/outputs 22 and 24 antifuses 14. As will be discussed below in further detail, a number of ways of making interlevel connections are known in the art. The present invention is not necessarily limited to a particular one.

Figure 11A:
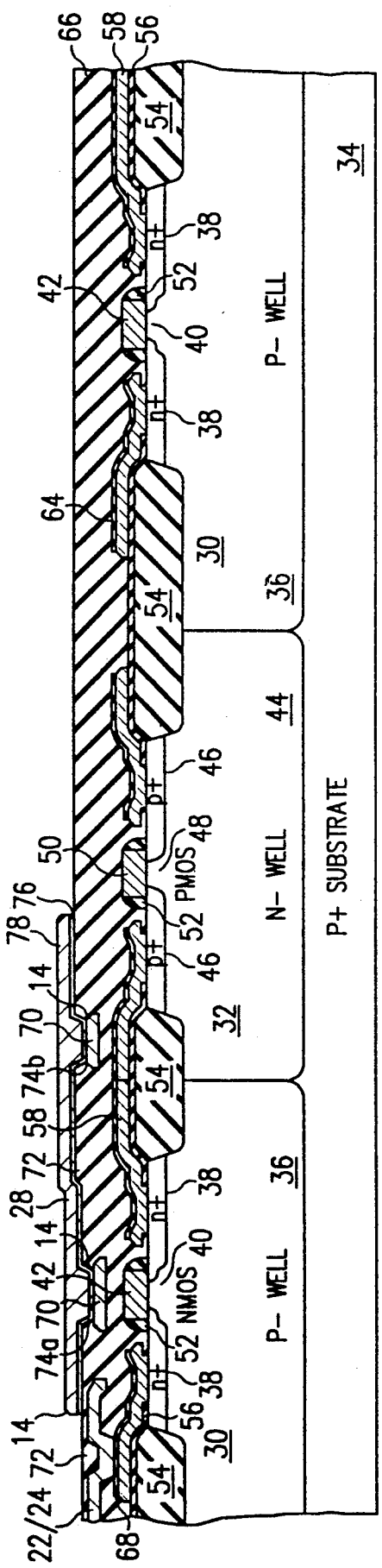

A first preferred fabrication alternative for the formation of anti-fuses 14 is depicted in FIG. 11A. A layer of insulator 72 is first formed across the face of the workpiece. Insulator layer 72 may be for example, a layer of oxide grown or deposited to a thickness of between 1,000 and 2,000 angstroms. Next, insulators layer 72 is patterned and etched to open windows in areas 74a and 74b. A layer of anti-fuse material 76, which may be a layer of thin dielectric or amorphous silicon is next formed, followed by the formation of a conductor layer 78. Conductor layer 78 may be conductive polycrystalline silicon, metal or silicide. Following patterning and etching, conductor 78 will become a conductor 28 providing the upper electrode for anti-fuses 14 as shown in FIG. 1a. Conductor layer 78 and anti-fuse material layer 76 are then patterned and etched to define a pair of anti-fuses 14 formed at two intersections of a conductor 28 and a pair of conductors 26. This fabrication method has the primary advantage of having reduced capacitive area between conductor 78 and underlying conductor 70 in the areas of windows 74A and 74B. The reduced capacitive area reduces the capacitance of anti-fuses 14 thereby increasing programming efficiency.

Figure 11B:
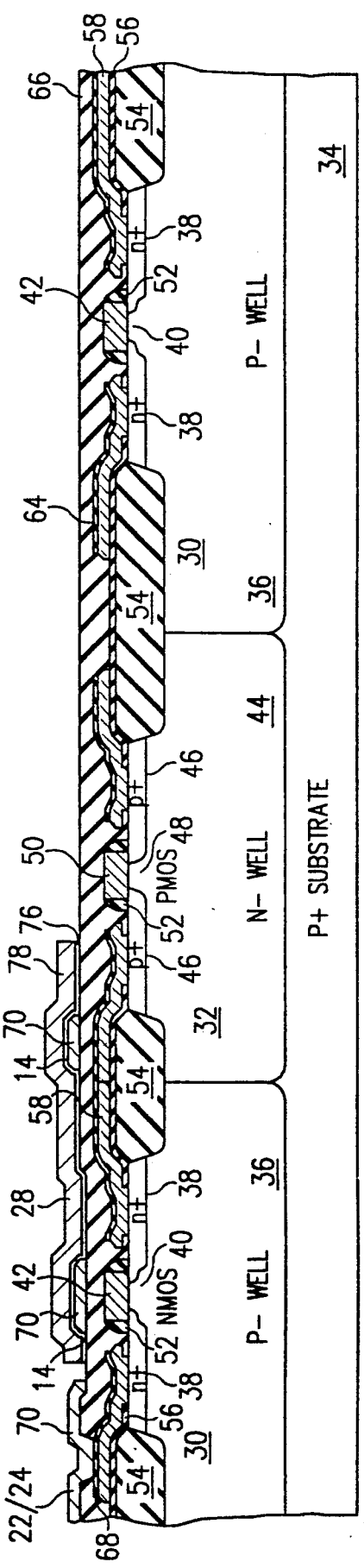

In FIG. 11B, an alternative method is shown for forming anti-fuses 14. In this instance, no oxide layer 72 is formed, rather, anti-fuse material layer 76 is formed directly following the patterning and etching of conductor layer 70. Next conductor layer 78 is formed across the face of the workpiece. The boundaries of conductor 28 and anti-fuses 14 are then defined by patterning and etching conductor layer 78 and anti-fuse material layer 76. This second fabrication option has the primary advantage of being self-aligned since the elimination of oxide layer 72 has also eliminated the need to open window areas 74. The elimination of the need to open window areas 74 simplifies the fabrication processing since the steps of patterning and etching windows 74, which include the substep of precise alignment of the masking, are not required.

Figure 12:
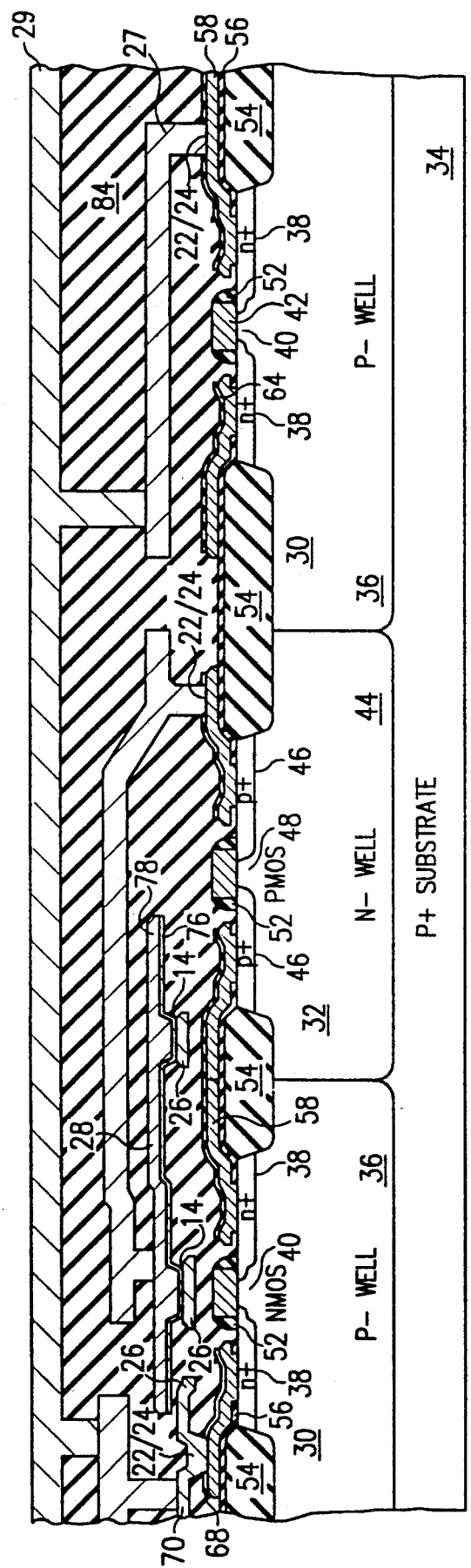

In FIG. 12, interlevel interconnections 27 and 29 are formed using conventional metal line techniques known in the art. Metal lines 27 and 29 provide a second way to connect up the input/output contacts 22 and 24 of the universal logic modules 12 composing the array with anti-fuses 14. Metal lines 27 and 29 are only one way of providing the required interlevel interconnections in the present invention. Other examples include the direct polysilicon to polysilicon connections previously discussed, other forms of polysilicon lines and single level metal lines. Metal lines may additionally be used to provide direct contacts between selected input/output contacts 22 and 24, as known in the art. The metal lines 27 and 29 are separated by layers of insulator 84 which are, for example, multi-level oxides. Following this step, the primary advantage of the present invention has been achieved: anti-fuses 14 have been vertically offset from universal logic modules 12. Anti-fuses 14 and their associated interconnection lines 26 and 28 have been interweaved into the stack, saving space on the substrate 34 surface.

Figure 13:
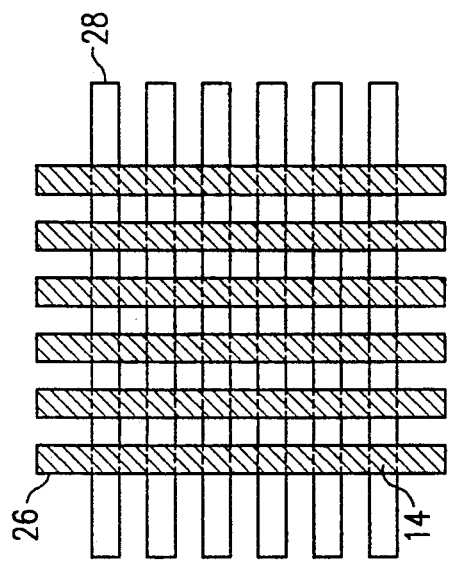
FIG. 13 is a plan view showing an example of the anti-fuse conductor configuration according to the present invention.

The programming of a selected fuse in the present invention is best described by referring to FIG. 13 which depicts the interrelationship between a number of conductors 26 and conductors 28. While FIG. 12 shows conductors 26 and conductors 28 as forming perpendicular rows and columns for clarity, the present invention is not necessarily limited to such a configuration. To program a selected anti-fuse 14, the programmer grounds either the conductor 26 or the conductor 28 corresponding the selected fuse 14. A voltage is then applied to the conductor 26 or 28 associated with the selected anti-fuse 14 which was not grounded. The creation of a voltage difference across the anti-fuse layer 76 corresponding to the selected anti-fuse 14 causes a short through anti-fuse material 76, thereby programming a connection at that point.

Thus, the present invention provides a field programmable gate array in which the anti-fuses 14 required for programming are vertically displaced from the underlying universal logic modules 12 rather than being laterally displaced on a separate surface area. This reduces the amount of semiconductor surface that is required to fabricate the field programmable gate array. Reduced surface area in turn leads to the significant advantage of reduced chip size. In the alternative, more universal logic modules can be fabricated on a given semiconductor surface area, thereby increasing the functional capabilities of the field programmable gate array. Although the present invention has been described in detail, it should be understood that various changes, substitutions and alterations can be made herein without departing from the scope and spirit of the invention as defined by the impended claims.

What is claimed is:

1. A method for forming an improved programmable logic array, comprising the steps of:

forming a plurality of functional devices at a face of a layer of semiconductor, each of said logic devices having at least one input/output terminal;

forming an array of anti-fuses vertically displaced at a level totally above said devices and said terminals; and forming a plurality of interlevel conductors extending above and below said array, coupling selected ones of said input/outputs with selected ones of said anti-fuses.

2. The method of claim 1, wherein said step of forming a plurality of anti-fuses further comprising the steps of:

forming a first layer of conductor;

selectively etching the first layer of conductor to form a plurality of rows of elongated conductors;

depositing and patterning a layer of insulator to form windows selectively exposing portions of said conductor;

forming a layer of anti-fuse material across the layer of insulator, the layer of anti-fuse material extending through the windows to contact the exposed portions of the first level of elongated conductors;

forming a second layer of conductor across the layer of anti-fuse material; and selectively etching the second layer of conductor and the layer of anti-fuse material to form a plurality of columns formed of elongated conductors having an adjacent layer of anti-fuse material, at an angle to the rows, such that an anti-fuse is disposed at the intersection of a row and a column.

3. The method of claim 1, wherein said step of forming a plurality of anti-fuses comprises the substeps of:

forming a first layer of conductor vertically spaced from the face of the layer of semiconductor;

selectively etching the first layer of conductor to define a plurality of rows of elongated conductors;

forming a layer of anti-fuse material adjacent the rows of elongated conductors;

forming a second layer of conductor adjacent the layer of anti-fuse material; and selectively etching the second layer of conductor and the layer of anti-fuse material to define a plurality of elongated conductors having an adjacent layer of anti-fuse material, the columns formed at an angle to the rows, such that an anti-fuse is disposed at the intersection of a row and a column.

* * * * *

UNITED STATES PATENT AND TRADEMARK OFFICE
CERTIFICATE OF CORRECTION

PATENT NO. : 5,106,773

DATED : April 21, 1992

INVENTOR(S) : Kueing-Long Chen, Kavid K. Liu, Howard L Tigelaar

It is certified that error appears in the above-identified patent and that said Letters Patent is hereby corrected as shown below:

On the title page, item (75):

The spelling of the first inventor's name has been corrected to read as follows:

Kueing-Long Chen

Signed and Sealed this

Seventh Day of September, 1993

Attest:

BRUCE LEHMAN

*Attesting Officer*     *Commissioner of Patents and Trademarks*